(12) United States Patent
Wang et al.

(10) Patent No.: US 11,244,968 B2
(45) Date of Patent: Feb. 8, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Wei Wang, Wuhan (CN); Qing Huang, Wuhan (CN)

( * ) Notice: Subject to any disclaimer, the term of this patent is extended or adjusted under 35 U.S.C. 154(b) by 192 days.

(21) Appl. No.: 16/496,457

(22) PCT Filed: Apr. 11, 2019

(86) PCT No.: PCT/CN2019/082182
§ 371 (c)(1),
(2) Date: Sep. 23, 2019

(87) PCT Pub. No.: WO2020/172958
PCT Pub. Date: Sep. 3, 2020

(65) Prior Publication Data
US 2021/0233938 A1  Jul. 29, 2021

(30) Foreign Application Priority Data
Feb. 28, 2012 (CN) .......................... 201910152202.0

(51) Int. Cl.
*H01L 27/12* (2006.01)
*H01L 23/00* (2006.01)
(52) U.S. Cl.
CPC ........ *H01L 27/1244* (2013.01); *H01L 23/562* (2013.01)

(58) Field of Classification Search
None
See application file for complete search history.

(56) References Cited

U.S. PATENT DOCUMENTS

2019/0088685 A1   3/2019   Huang et al.

FOREIGN PATENT DOCUMENTS

| CN | 106252380 A | 12/2016 |
| CN | 107634086 A | 1/2018 |
| CN | 108198827 A | 6/2018 |
| CN | 108766245 A | 11/2018 |
| CN | 108986666 A | 12/2018 |
| CN | 109346487 A | 2/2019 |

OTHER PUBLICATIONS

Translation of CN107634086A, total pages 12. (Year: 2018).*
Translation of CN108198827A, total pages 16. (Year: 2018).*

* cited by examiner

*Primary Examiner* — Bo B Jang

(57) ABSTRACT

The present invention discloses a display panel and a display device. By adding a stress adjustment layer having a plurality of patterned structures spaced apart from each other, the stress neutral surface can be effectively adjusted, and the stress of the metal trace is reduced when it is bent, to avoid or mitigate excessive stress causing generation and expansion of cracks in the stress adjustment layer, thereby reducing the probability of breakage of the metal trace when the flexible display is bent, thus reducing the risk of failure of the metal trace.

16 Claims, 4 Drawing Sheets

DISPLAY PANEL AND DISPLAY DEVICE

BACKGROUND OF INVENTION

Field of Invention

The present invention relates to a field of display technologies, and in particular, to a display panel and a display device.

Description of Prior Art

As a new generation of display products, a flexible display device has attracted more and more attention because of its advantages of ultra-lightness, ultra-thinness, high definition, fast response times, flexibility, and portability. A flexible display panel of the flexible display device adopts a soft and flexible plastic substrate, which is very suitable for manufacture of the display device having a narrow bezel. This is because a peripheral area of the flexible display panel can be bent or folded to be disposed on a side or a bottom of a screen, thereby reducing a proportion of the non-display area in the front area, and achieving a narrow bezel design. For example, the flexible display panel can adopt a chip on panel (COP) process, and a metal trace in the peripheral area (the metal traces connecting gate driver on array (GOA) or an active display area (AA) to a driving chip) can be directly fabricated on the flexible substrate by using an array process, and the flexible circuit board can be omitted. As such, by designing a bending region, the metal traces and the driving chip in the peripheral area can be folded to the side or bottom the display area to realize the narrow bezel design.

Referring to FIGS. 1A-1C, FIG. 1A is a top view of the flexible display device, FIG. 1B is a cross-sectional view of the flexible display device shown in FIG. 1A when it is bent, and FIG. 1C is a cross-sectional view of film structure in the bending region along the line AA' of FIG. 1A. The flexible display panel of the flexible display device includes a display area 11 and a non-display area 12 which is bendable at the periphery of the display area 11. The non-display area 12 includes a driving chip area 121, a peripheral trace area 123, and a bending region 122 between the peripheral trace areas 123 and the driving chip area 121. The peripheral trace area 123 is connected to the display area 11 (or the GOA area) and the driving chip 1211 of the driving chip area 121 by a metal trace. The peripheral trace region 123 and the driving chip region 121 are folded at the bending region 122 to the side or bottom of the display region 11, as shown in FIG. 1B, to realize a narrow bezel design.

As shown in FIG. 1C, the bending region 122 includes a flexible substrate 101, a first organic layer 102, a metal trace 103, a second organic layer 104, a third organic layer 105, and a fourth organic layer 106 which are sequentially stacked. As can be seen from the film structure shown in FIG. 1C, the metal trace 103 is located between the stacked films. Since the flexible substrate 101 has a greater thickness and a larger Young's modulus, a stress neutral surface is generally located in the substrate material, and the metal trace 103 is located above the neutral surface. Examples of typical values of the Young's modulus and Poisson's ratio of the bending region involving the film materials are shown in Table 1 below. The flexible display needs to be rolled up or bent during use, even frequently bent, such that, when it is bent, the metal trace 103 is subjected to a large stress, and cracks or breaks are easily generated, resulting in an increase in the resistance of the metal trace 103, or even breakage, causing a display anomalies.

TABLE 1

Examples of typical values of the Young's modulus and Poisson's ratio of the film materials of the bending region.

| Material | Young Modulus (Mpa) | Poisson's ratio |
|---|---|---|
| PET film | 4000 | 0.35 |
| planarization layer | 3400 | 0.30 |
| flexible substrate- polyimide | 9200 | 0.35 |
| Al | 71000 | 0.33 |
| Ti | 102000 | 0.30 |
| amorphous silica | 73100 | 0.17 |
| amorphous silicon nitride | 226000 | 0.288 |

Therefore, how to effectively adjust the stress neutral surface, reduce the stress of the metal trace when it is bent, reduce the probability of breakage of the metal trace when the flexible display is bent, and reduce the risk of failure of the metal trace, are urgent problems that need to be solved in developments of the flexible display, narrow bezel, or bezel free technology.

SUMMARY OF INVENTION

An object of the present invention is to provide a display panel and a display device to solve the problems that the existing display panel has a large stress on a metal trace when it is bent, and crack or breakage are easily generated. By adjusting the stress neutral surface, the stress of the metal trace is reduced when it is bent, thus reducing the probability of breakage of the metal trace when the flexible display is bent, and reducing the risk of failure of the metal trace.

To achieve the above object, the present invention provides a display panel including a bending region, the bending region including a flexible substrate, wherein the bending region further includes: a first metal trace and at least one stress adjustment layer above the flexible substrate, the stress adjustment layer including a plurality of patterned structures spaced apart from each other, each of the patterned structures being a polygon or having at least one side of an arc, the plurality of patterned structures being arranged in a plurality of rows, and at least two rows of the patterned structures being non-aligned in a second direction, wherein a direction of the first metal trace is defined as a first direction, a direction perpendicular to the direction of the first row is defined as the second direction, and the patterned structures of the stress adjustment layer arranged along the first direction are defined as a row of the patterned structures.

To achieve the above object, the present invention also provides a display panel including a bending region, the bending region including a flexible substrate, wherein the bending region further includes: a first metal trace and at least one stress adjustment layer above the flexible substrate, and the stress adjustment layer includes a plurality of patterned structures spaced apart from each other.

To achieve the above object, the present invention also provides a display device including a display panel, the display panel including a bending region, the bending region including a flexible substrate; wherein the bending region further includes: a first metal trace and at least one stress adjustment layer above the flexible substrate, and the stress adjustment layer includes a plurality of patterned structures spaced apart from each other.

The present invention has the advantages that: by adding a stress adjustment layer having a plurality of pattern structures spaced apart from each other, the display panel of the present invention can adjust the stress neutral surface, reduce the stress of the metal trace when it is bent, avoid or mitigate excessive stress causing generation and expansion of cracks in the stress adjustment layer, thereby reducing the probability of breakage of the metal trace when the flexible display is bent, thus reducing the risk of failure of the metal trace.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1A:
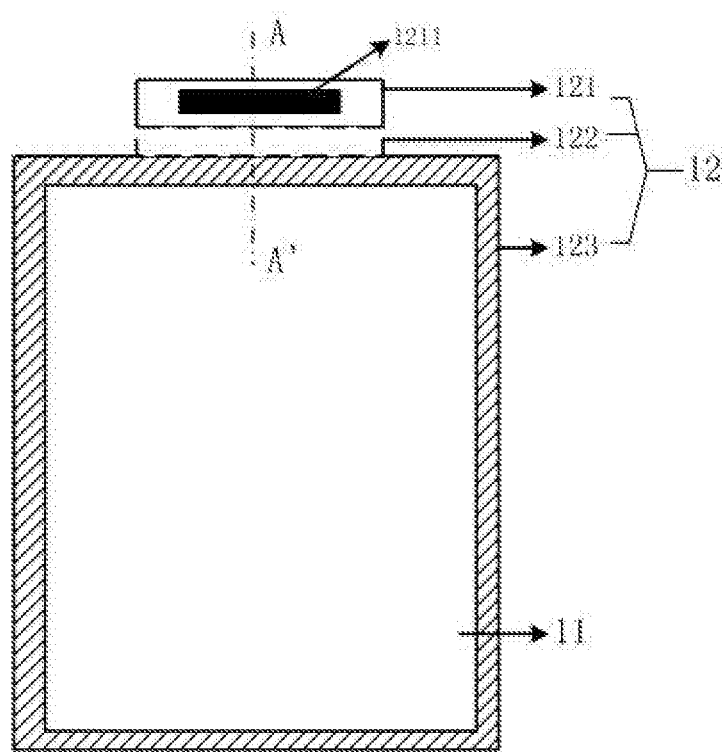
FIG. 1A is a top view of a conventional flexible display device.
Figure 1B:
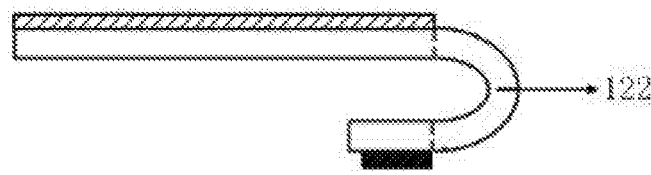
FIG. 1B is a cross-sectional view of the flexible display device shown in FIG. 1A when it is bent.
Figure 1C:
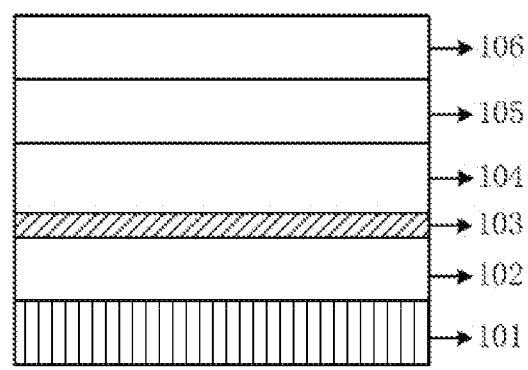
FIG. 1C is a cross-sectional view of the film structure in the bending region along the line AA' of FIG. 1A.

With reference to the appended drawings, exemplary embodiments of the present invention will be described in detail below. To aid in understanding the present invention, like numbers refer to like elements throughout the description of the figures, and the description of the same elements will be not reiterated. For illustration clarity, many details of practice are explained in the following descriptions. However, it should be understood that these details of practice do not intend to limit the present disclosure.

In the present invention, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the present invention. In addition, the present invention may repeat reference numerals and/or reference letters in the various embodiments, which are for the purpose of simplicity and clarity, and do not indicate the relationship between the various embodiments and/or arrangements discussed. Moreover, the present invention provides examples of various specific processes and materials, but one of ordinary skill in the art will recognize the use of other processes and/or the use of other materials.

The display panel of the present invention includes a bending region, the bending region including a flexible substrate, at least one metal trace and at least one stress adjustment layer above the flexible substrate, the stress adjustment layer including a plurality of patterned structures spaced apart from each other. The stress adjustment layer having a plurality of pattern structures spaced apart from each other is introduced, which can adjust the stress neutral surface and reduce the stress on the metal trace when it is bent. In addition, the plurality of pattern structures spaced apart from each other are designed in the stress adjustment layer, which can avoid or mitigate excessive stress causing generation and expansion of cracks in the stress adjustment layer. The display panel may be, for example, a flexible OLED display panel and a flexible LCD display panel etc., and other essential components of the display panel may be present, which are understood by those of ordinary skill in the art, and are not described herein for brevity. It should not be construed as limiting the present invention.

Preferably, the stress adjustment layer is made of an inorganic or metallic material to effectively adjust the stress neutral surface.

Preferably, the plurality of patterned structures are arranged in a plurality of rows, and at least two rows of the patterned structures are non-aligned in a second direction, to avoid or mitigate excessive stress causing generation and expansion of cracks in the stress adjustment layer. A direction of the first metal trace is defined as a first direction, a direction perpendicular to the direction of the first row is defined as the second direction, and the patterned structures of the stress adjustment layer arranged along the first direction are defined as a row of the patterned structures. Preferably, the patterned structures in a same row may be evenly distributed to simplify the process.

Preferably, each of the patterned structures of the stress adjustment layer is a polygon or having at least one side of an arc to avoid or mitigate excessive stress causing generation and expansion of cracks in the stress adjustment layer.

Preferably, the first metal trace is disposed between the plurality of the patterned structures in a top view, so that the stress neutral surface can be effectively adjusted. For example, the stress adjustment layer may be disposed above the metal trace; or the stress adjustment layer and the metal trace may be at a same level and alternately arranged.

The film structure of the bending region of the display panel according to the present invention is an improved film structure. The stress adjustment layer having a plurality of pattern structures spaced apart from each other is introduced, which can adjust the stress neutral surface, reduce the stress on the metal trace when it is bent, and avoid or mitigate excessive stress causing generation and expansion of cracks in the stress adjustment layer, thereby reducing the probability of breakage of the metal trace when the flexible display is bent, and reducing the risk of failure of the metal trace. Each of the patterned structures is a polygon or having at least one side of an arc, the plurality of patterned structures being arranged in a plurality of rows, and/or at least two rows of the patterned structures being non-aligned in a second direction, to further avoid or mitigate excessive stress causing generation and expansion of cracks in the stress adjustment layer. The stress adjustment layer can be made of a material having a large Young's modulus such as inorganic or metal material to effectively adjust the stress neutral surface.

The display panel of the present invention may include a plurality of stress adjustment layers. The display panel of the present invention may further include two layers of metal traces. In this case, the stress adjustment layer is located above a first metal trace and/or a second metal trace, or the stress adjustment layer is at a same level with the first metal trace and/or the second metal trace. Further explanation is given below in conjunction with the examples.

Figure 2A:
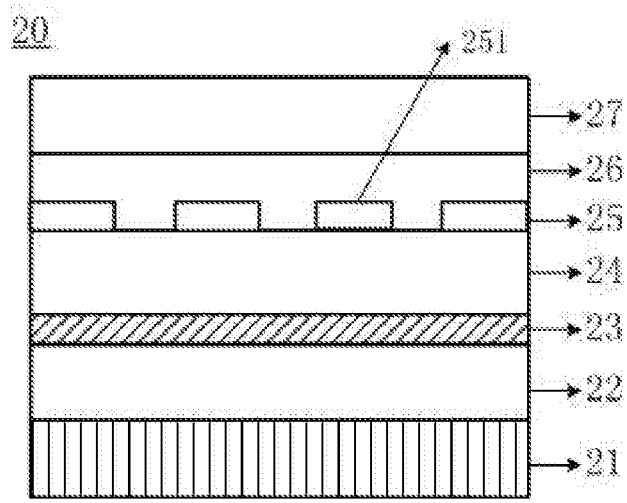
FIG. 2A is a cross-sectional view of the film structure of the display panel according to a first embodiment the present invention.
Figure 2B:
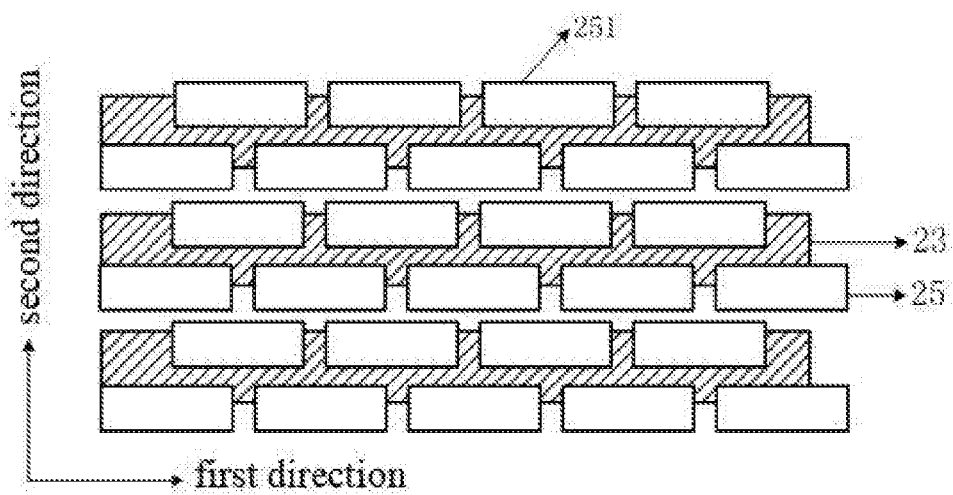
FIG. 2B is a top view of the first metal trace and the stress adjustment layer in the film structure shown in FIG. 2A.

Referring to FIGS. 2A-2B, FIG. 2A is a cross-sectional view of the film structure of the display panel according to a first embodiment the present invention, and FIG. 2B is a top view of the first metal trace and the stress adjustment layer in the film structure shown in FIG. 2A. In this embodiment, the bending region 20 of the display panel includes: a flexible substrate 21, a first organic layer 22 on the flexible substrate 21, and a first metal trace 23, a second organic layer 24, and the stress adjustment layer 25 sequentially disposed on the first organic layer 22. The stress adjustment layer 25 includes a plurality of pattern structures 251 spaced apart from each other. The metal trace is located between the plurality of patterned structures in a top view, so that the stress neutral surface can be effectively adjusted. In other embodiments, two or more stress adjustment layers 25 may be disposed above the first metal trace 23 to effectively adjust the stress neutral surface.

The flexible substrate 21 may be a flexible and bendable plastic substrate.

The first organic layer 22 may be made of an organic material having good bendability.

The first metal trace 23 is configured to connect the driving chips of the display area or the gate driver on array (GOA) area of the flexible display panel.

The second organic layer 24 may be made of an organic material having good bendability, and the film layer may be thicker to fill the unevenness of a underlying metal trace to facilitate the fabrication of an improved layer circuit.

The stress adjustment layer 25 can effectively adjust the stress neutral surface and reduce the stress of the metal trace when it is bent. The stress adjustment layer 25 has certain patterned structures 251, and the patterned structures 251 are separated from each other, which can avoid or mitigate excessive stress causing generation and expansion of cracks in the stress adjustment layer, thereby reducing the probability of breakage of the metal trace when the flexible display is bent, and reducing the risk of failure of the metal trace. The stress adjustment layer 25 can be made of an inorganic or metallic material to effectively adjust the stress neutral surface.

Specifically, as shown in FIG. 2B, the stress adjustment layer 25 is disposed above the first metal trace 23. A direction of the first metal trace 23 is defined as a first direction, a direction perpendicular to the direction of the first row is defined as the second direction, and the patterned structures 251 of the stress adjustment layer 25 arranged along the first direction are defined as a row of the patterned structures. The stress adjustment layer 25 includes a plurality of patterned structures 251 spaced apart from each other and arranged in a plurality of rows. Preferably, at least two rows of the patterned structures 251 are non-aligned in the second direction to further avoid or mitigate excessive stress causing generation and expansion of cracks in the stress adjustment layer. Each of the patterned structures 251 may be a polygon or at least one edge is an arc to further avoid or mitigate excessive stress causing generation and expansion of cracks in the stress adjustment layer. Preferably, the patterned structures of the same row may be evenly distributed to simplify the process.

Still referring to FIG. 2A, in the present embodiment, other films, such as a third organic layer 26 and a fourth organic layer 27 as shown in the drawing, may be disposed above the stress adjustment layer 25 subsequentially.

In the bending region 20 of this embodiment, by adding the stress adjustment layer 25 including the plurality of patterned structures 251 spaced apart from each other, the stress neutral surface can be adjusted, the stress on the metal trace during bending can be reduced, and the excessive stress causing generation and expansion of cracks in the stress adjustment layer can be avoided or mitigated, thereby reducing the probability of breakage of the metal trace when the flexible display is bent, and reduce the risk of failure of the metal trace. Each of the patterned structures 251 being a polygon or having at least one side of an arc, and/or at least two rows of the patterned structures 251 are non-aligned in the second direction to further avoid or mitigate the excessive stress causing generation and expansion of cracks in the stress adjustment layer 25. The patterned structures 251 of the same row may be evenly distributed to simplify the process. The stress adjustment layer 25 can be made of a material having a large Young's modulus such as inorganic or metal material to effectively adjust the stress neutral surface.

Figure 3A:
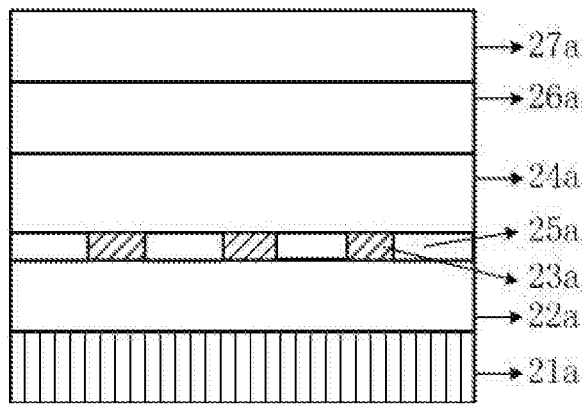
FIG. 3A is a cross-sectional view showing a film structure of the display panel according to a second embodiment of the present invention.
Figure 3B:
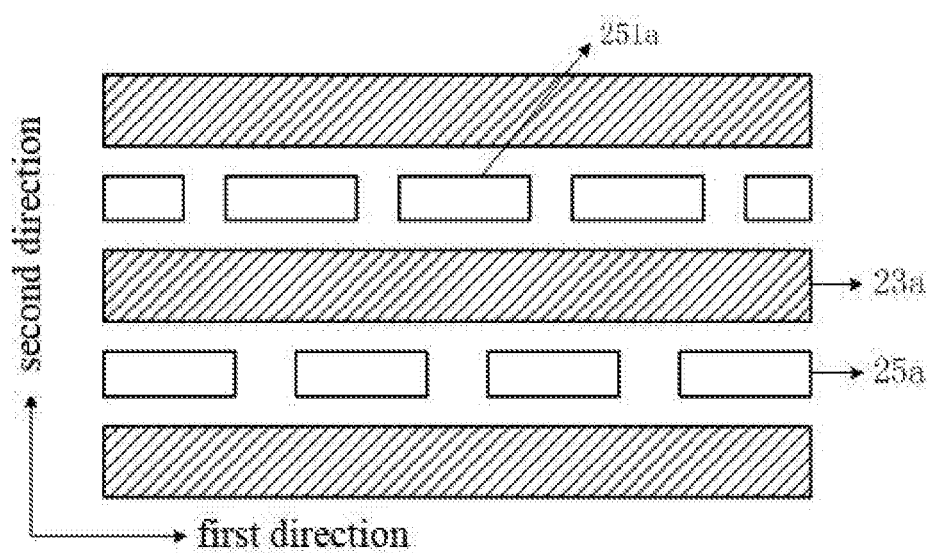
FIG. 3B is a top view of the first metal trace and the stress adjustment layer in the film structure shown in FIG. 3A.

Referring to FIGS. 3A-3B, FIG. 3A is a cross-sectional view showing a film structure of the display panel according to a second embodiment of the present invention, and FIG. 3B is a top view of the first metal trace and the stress adjustment layer in the film structure shown in FIG. 3A. The metal trace is located between the plurality of patterned structures in a top view, so that the stress neutral surface can be effectively adjusted. A difference between the embodiments shown in FIG. 2A and FIG. 3A is that, in this embodiment, the stress adjustment layer 25a and the first metal trace 23a are at a same level and alternately arranged.

Specifically, in this embodiment, the bending region 20a includes: a flexible substrate 21a, a first organic layer 22a disposed on the flexible substrate 21a, a first metal trace 23a and a stress adjustment layer 25a disposed at a same level and alternately arranged, a second organic layer 24a covering the first metal trace 23a and the stress adjustment layer 25a, and a third organic layer 26a, and a fourth organic layer 27a sequentially stacked on the second organic layer 24a. The stress adjustment layer 25a includes a plurality of pattern structures 251a spaced apart from each other. In other embodiments, one or more stress adjustment layers 25a may be further disposed on the first metal trace 23a and the stress adjustment layer 25a disposed at a same level and spaced apart to effectively adjust the stress neutral surface. For example, the stress adjustment layer 25a may be disposed on the second organic layer 24a, or the stress adjustment layer 25a may be disposed on each of the second organic layer 24a and the third organic layer 26.

As shown in FIG. 3B, the first metal traces 23a and the stress adjustment layer 25a are alternately arranged at a same level, and the stress adjustment layer 25a includes a plurality of pattern structures 251a spaced apart from each other. Specifically, the first metal trace 23a and the stress adjustment layer 25a are alternately arranged along a direction perpendicular to the direction in which the first metal trace 23a extends.

Preferably, at least two rows of the patterned structures 251a are non-aligned and arranged in a second direction perpendicular to the trace direction (i.e., the first direction) of the first metal traces 23a to further avoid or mitigate excessive stress causing generation and expansion of cracks in the stress adjustment layer. Each of the patterned structures 251a is a polygon or at least one side is an arc to further avoid or mitigate the excessive stress causing generation and expansion of cracks in the stress adjustment layer 25. The patterned structures 251a of the same row may be evenly distributed to simplify the process. The stress adjustment layer 25a may be made of an inorganic or a metallic material to effectively adjust the stress neutral surface.

Figure 4:
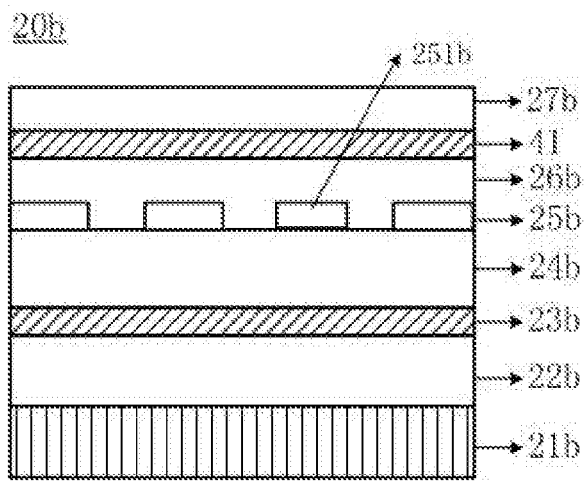
FIG. 4 is a schematic view showing a film structure of the display panel according to a third embodiment of the present invention.

Referring to FIG. 4, a schematic view shows a film structure of the display panel according to a third embodiment of the present invention. A difference between the embodiments shown in FIG. 2A and FIG. 4 is that, in this embodiment, a bending region 20b further includes a second metal trace 41 disposed above the first metal trace 23b. That is, the bending region 20b of the present embodiment includes two layers of metal traces, and the stress adjustment layer is located between the first metal trace 23b and the second metal trace 41. Preferably, two or more stress adjustment layers 25b may be disposed between the first metal trace 23b and the second metal trace 41 to effectively adjust the stress neutral surface.

Specifically, in this embodiment, the bending region 20b includes: a flexible substrate 21b, a first organic layer 22b disposed on the flexible substrate 21b, and a first metal trace 23b, a second organic layer 24b, a stress adjustment layer 25b, a third organic layer 26b, a second metal trace 41, and a fourth organic layer 27b sequentially stacked on the first organic layer 22b. The stress adjustment layer 25b includes a plurality of patterned structures 251b. In other embodiments, the stress adjustment layer 25b may be disposed above the second metal trace 41. Alternatively, at least one stress adjustment layer 25b may be disposed between the first metal trace 23b and the second metal trace 41 and above the second metal trace 41 to effectively adjust the stress neutral surface.

Figure 5:
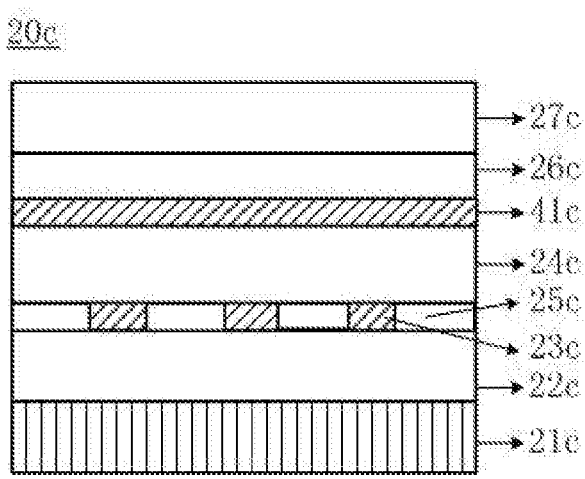
FIG. 5 is a schematic view showing a film structure of a fourth embodiment of the display panel of the present invention.

Referring to FIG. 5, a schematic view shows a film structure of a fourth embodiment of the display panel of the present invention. A difference between the embodiments shown in FIG. 3A and FIG. 5 is that, in this embodiment, a bending region 20c further includes a second metal trace 41c disposed above the first metal trace 23c. That is, in the bending region 20c of this embodiment, two layers of the metal traces are included, and the stress adjustment layer 25c and the first metal traces 23c are disposed at a same level and alternately arranged. Preferably, one or more stress adjustment layers 25c may be disposed between the first metal trace 23c and the second metal trace 41c, and/or above the second metal trace 41c to effectively adjust the stress neutral surface.

Specifically, in the embodiment, the bending region 20c includes: a flexible substrate 21c, a first organic layer 22c disposed on the flexible substrate 21c, a first metal trace 23c and a stress adjustment layer 25c disposed at a same level and alternately arranged, a second organic layer 24c covering the first metal trace 23c and the stress adjustment layer 25c, and a second metal trace 41c, a third organic layer 26c, and a fourth organic layer 27c sequentially stacked on the second organic layer 24c. The stress adjustment layer 25c includes a plurality of pattern structures 251c spaced apart from each other. In other embodiments, the stress adjustment layer 25c and the second metal trace 41c may be alternately arranged at a same level, preferably, between the first metal trace 23c and the second metal trace 41c, or one or more stress adjustment layers 25c may be disposed above the second metal trace 41c to effectively adjust the stress neutral surface. In other embodiments, the first metal trace 23c and the stress adjustment layer 25c disposed on the first metal trace 23c are alternately arranged at a same level, and the second metal trace 41c and the stress adjustment layer 25c disposed on the second metal trace 41c are alternately arranged at a same level. Preferably, one or more stress adjustment layers 25c may be disposed between the first metal trace 23c and the second metal trace 41c, and/or above the second metal trace 41c to effectively adjust the stress neutral surface.

Based on the same inventive concept, the present invention also provides a display device including the above display panel. The display device may be, for example, a liquid crystal television, a smart phone, a liquid crystal screen, etc., and other essential components of the display panel may be present, which are understood by those of ordinary skill in the art, and are not described herein for brevity. It should not be construed as limiting the present invention. By using a display panel with a stress adjustment layer, the stress neutral surface can be adjusted, and the stress of the metal trace is reduced when it is bent, to avoid or mitigate excessive stress causing generation and expansion of cracks in the stress adjustment layer, thereby reducing the probability of breakage of the metal trace when the flexible display is bent, thus reducing the risk of failure of the metal trace.

INDUSTRIAL APPLICABILITY

The subject matter of the present application can be manufactured and used in the industry, and thus has industrial applicability.

What is claimed is:

1. A display panel, comprising a bending region, the bending region comprising a flexible substrate, wherein the bending region further comprises: a first metal trace, at least one stress adjustment layer, and a second metal trace disposed above the first metal trace above the flexible substrate, the stress adjustment layer comprising a plurality of patterned structures spaced apart from each other, each of the plurality of patterned structures being a polygon or having at least one side of an arc, the plurality of patterned structures being arranged in a plurality of rows, and the patterned structures of at least two rows being non-aligned in a second direction, wherein
   a direction of the first metal trace is defined as a first direction, a direction perpendicular to the direction of the first direction is defined as the second direction, and the patterned structures arranged along the first direction are defined as a row of the patterned structures; and
   wherein both of the first metal trace and the second metal trace are arranged between the plurality of patterned structures in a top view.

2. The display panel of claim 1, wherein the stress adjustment layer is made of an inorganic or metallic material.

3. The display panel of claim 1, wherein the patterned structures of a same row are evenly distributed.

4. The display panel of claim 1, wherein the first metal trace is disposed between the plurality of patterned structures in a top view.

5. The display panel of claim 4, wherein
the stress adjustment layer is disposed above the first metal trace.

6. The display panel of claim 1, wherein
the stress adjustment layer is disposed between the first metal trace and the second metal trace; or
the stress adjustment layer is disposed above the second metal trace; or
the stress adjustment layer is disposed between the first metal trace and the second metal trace, and disposed above the second metal trace.

7. The display panel of claim 1, wherein the stress adjustment layer and the first metal trace are at a same level and alternately arranged, and/or the stress adjustment layer and the second metal trace are at a same level and alternately arranged.

8. A display panel, comprising a bending region, the bending region comprising a flexible substrate, wherein the bending region further comprises: a first metal trace, at least one stress adjustment layer, and a second metal trace disposed above the first metal trace above the flexible substrate, and the stress adjustment layer comprises a plurality of patterned structures spaced apart from each other;
wherein all the plurality of patterned structures are disposed in a same layer, and both of the first metal trace and the second metal trace are arranged between the plurality of patterned structures in a top view;
wherein the plurality of patterned structures are arranged in a plurality of rows, and the patterned structures of at least two rows are non-aligned in a second direction; and
wherein a direction of the first metal trace is defined as a first direction, a direction perpendicular to the direction of the first direction is defined as the second direction, and the patterned structures of the stress adjustment layer arranged along the first direction are defined as a row of the patterned structures.

9. The display panel of claim 8, wherein the stress adjustment layer is made of an inorganic or metallic material.

10. The display panel of claim 8, wherein the patterned structures of a same row are evenly distributed.

11. The display panel of claim 8, wherein each of the plurality of patterned structures is a polygon or has at least one side of an arc.

12. The display panel of claim 8, wherein the first metal trace is disposed between the plurality of patterned structures in a top view.

13. The display panel of claim 12, wherein
the stress adjustment layer is disposed above the first metal trace.

14. The display panel of claim 8, wherein
the stress adjustment layer is disposed between the first metal trace and the second metal trace; or
the stress adjustment layer is disposed above the second metal trace; or
the stress adjustment layer is disposed between the first metal trace and the second metal trace, and disposed above the second metal trace.

15. The display panel of claim 8, wherein the stress adjustment layer and the first metal trace are at a same level and alternately arranged, and/or the stress adjustment layer and the second metal trace are at a same level and alternately arranged.

16. A display device, comprising a display panel, the display panel comprising a bending region, the bending region comprising a flexible substrate; wherein the bending region further comprises: a first metal trace, at least one stress adjustment layer, and a second metal trace disposed above the first metal trace above the flexible substrate, and the stress adjustment layer comprises a plurality of patterned structures spaced apart from each other;
wherein all the plurality of patterned structures are disposed in a same layer, and both of the first metal trace and the second metal trace are arranged between the plurality of patterned structures in a top view;
wherein the plurality of patterned structures are arranged in a plurality of rows, and the patterned structures of at least two rows are non-aligned in a second direction; and
wherein a direction of the first metal trace is defined as a first direction, a direction perpendicular to the direction of the first direction is defined as the second direction, and the patterned structures of the stress adjustment layer arranged along the first direction are defined as a row of the patterned structures.

* * * * *